(12) United States Patent
Pearce et al.

(10) Patent No.: US 7,844,750 B2
(45) Date of Patent: *Nov. 30, 2010

(54) ADVANCED FAN CONTROL AND IDENTIFICATION SYSTEM AND METHOD

(75) Inventors: Jerry W. Pearce, Apex, NC (US); Thomas J. Clement, Raleigh, NC (US)

(73) Assignee: Lenovo (Singapore) Pte. Ltd., Singapore (SG)

( * ) Notice: Subject to any disclaimer, the term of this patent is extended or adjusted under 35 U.S.C. 154(b) by 977 days.

This patent is subject to a terminal disclaimer.

(21) Appl. No.: 11/585,714

(22) Filed: Oct. 24, 2006

(65) Prior Publication Data

US 2008/0093458 A1    Apr. 24, 2008

(51) Int. Cl.
*G06F 3/00* (2006.01)
*G06F 13/12* (2006.01)
*G06F 13/38* (2006.01)

(52) U.S. Cl. .................. 710/15; 710/8; 710/62

(58) Field of Classification Search .............. 710/15, 710/8, 62
See application file for complete search history.

(56) References Cited

U.S. PATENT DOCUMENTS

| | | | |
|---|---|---|---|
| 5,714,750 A | 2/1998 | Eastman | 235/462 |
| 5,756,981 A | 5/1998 | Roustaei | 235/462 |
| 6,392,372 B1 | 5/2002 | Mays | 318/254 |
| 6,725,132 B2 * | 4/2004 | Frankel et al. | 700/300 |
| 7,319,299 B2 * | 1/2008 | Freeman et al. | 318/66 |
| 2002/0088615 A1 * | 7/2002 | Dixon et al. | 165/287 |
| 2005/0286875 A1 * | 12/2005 | Haller | 388/827 |

\* cited by examiner

*Primary Examiner*—Chun-Kuan Lee
*Assistant Examiner*—Zachary K Huson

(57) ABSTRACT

A computer system is capable of operating with various types of fans from the same manufacturer or from different manufacturers and is capable identifying the type of fan which is presently installed in the system. The system includes a fan of the type which includes an integral optical sensor and detectable indicia such as, by way of example, a bar code label or imprint. Fan identification has a variety of uses including, for instance, adjusting system parameters to properly execute the computer system's cooling functions based on the type of fan presently installed, and reporting fan type and/or serial number to an administrator or central inventory server for quality control purposes. Particular embodiments include the derivation of tachometric information from the detectable indicia. The computer system may include an inventory program which maintains fan ID data for a plurality of fans.

23 Claims, 2 Drawing Sheets

ADVANCED FAN CONTROL AND IDENTIFICATION SYSTEM AND METHOD

CROSS-REFERENCE TO RELATED APPLICATIONS

The present invention is related to the subject matter of the following commonly assigned, copending U.S. patent applications Ser. Nos. 11/167,751 entitled "Determining Types of Cooling Fans Used in a Personal computer Thereby Using Optimum Parameters to Control Each Unique Cooling Fan" and filed 27 Jun. 2005; and Ser. No. 11/585,385 entitled "Motherboard Having Advanced Fan Control Features" and filed contemporaneously herewith.

BACKGROUND OF THE INVENTION

This invention pertains to computer systems and other information handling systems and, more particularly, to a computer system which is capable of detecting the type of fan being used in the system.

Generally, a computer system includes a board with various Large Scale Integration (LSI) chips such as a processor mounted thereon, a storage device such as a hard disk, a battery device, and input/output devices, each of which is known to generate heat as each operates in a computer. For some electrical components, such as a processor, a temperature range is often indicated by specifications which set a temperature range indicative of satisfactory and/or optimum performance (hereinafter, as used herein, this temperature and range may also be referred to as "rated temperature"), and often one or more cooling fans are typically provided in conjunction with electrical components in a computer system to keep the temperature in the system within the rated temperature.

A computer system may include multiple processors or electrical components that each need to be cooled by a different cooling fan. The speed of each of these cooling fans may be controlled by a program embedded in the system Basic Input/Output System (BIOS) code. Typically, the speed of each of these fans is controlled by a pulse width modulated signal at an input terminal of the more modern fans, and by pulsing a supply voltage to the fan in older fans. The pulse supplied to the older fans may vary based on the width, amplitude and frequency of the pulse. These characteristics (PWM input, and power supply pulse width, amplitude and frequency) may all be used to control the speed of the cooling fan.

Cooling fans may be manufactured from different manufacturers and may include different designs that each has specific PWM characteristics or, in the case of older fans, supply voltage characteristic requirements for optimum performance.

SUMMARY OF THE INVENTION

However, in light of the above and as broadly contemplated by the present invention, it is recognized herein that there is a need for systems to work with a variety of cooling fans. In order to control fan PWM characteristics or supply voltage for various cooling fans, the parameters or characteristics typically used are not optimum for any of the cooling fans. By not using the optimum parameters or supply voltage characteristics for any of the cooling fans, the cooling fans may be running faster than necessary or operating for a longer duration than necessary or using more power than necessary. Furthermore, the cooling fans may be operating with a greater amount of noise than necessary by not using the optimum parameters.

If, however, each particular cooling fan in the computer system could be operated using the optimum parameters for that cooling fan, then the cooling fans may be operating more efficiently thereby saving power. Furthermore, the cooling fans may be operating more quietly.

Therefore, there is a need in the art to operate each unique cooling fan in the computer system by using its own optimum parameters or characteristics.

Broadly contemplated herein, in accordance with at least one presently preferred embodiment of the present invention, a method includes reading a coded signal generated by a fan having an integral optical sensor which detects coded indicia applied to a rotating member of the fan, wherein the fan cools a predetermined component in a computer system; determining the fan type, wherein the coded signal read in said reading is used as a basis for the determination; and establishing a parameter which controls an aspect of the computer system based on the determination.

According to one non-limiting aspect of the present invention, apparatus includes a main processor which executes instructions stored in an accessible memory; a fan having an integral optical sensor wherein the optical sensor reads coded indicia disposed on a rotatable portion of the fan and generates an electrical signal corresponding to the coded indicia; and fan circuitry which couples the main processor and the fan and which provides data to the main processor as processor-addressable data, the data being representative of the electrical signal generated by the optical sensor of the fan. The data is used in the apparatus to identify a characteristic of the fan, and a fan-related signal is used in the apparatus to perform a second function, the fan-related signal being an electrical signal or the data itself.

In one non-limiting implementation, a parameter which controls the speed of the fan is established as a function of the data.

In some embodiments, the second function is a tachometric function which derives fan speed from the fan-related signal.

In one embodiment, the second function is a function which reports a fan characteristic over a network.

In one embodiment, the fan is run at a predetermined speed while the optical sensor reads the coded indicia disposed on the rotatable portion of the fan, the predetermined speed being slower than a nominal fan speed.

In one embodiment, the main processor executes instructions stored in the accessible memory which are effective to identify the characteristic of the fan by decoding the data.

In one embodiment, the fan circuitry further includes a register which is addressable by the main processor, and a translator which decodes the electrical signal and generates the data as decoded data which identifies the characteristic of the fan and stores the data in the register for access by the main processor.

It is contemplated that the use of coded indicia provides the ability to encode a larger data set so as to, for example, encode with finer granularity the manufacturer data, fan type, fan part number, lot number, fan serial number, and the like. Upon detection, the finer granularity provides for detailed reporting of manufacturer data, fan type, fan part number, lot number, fan serial number, etc., to an administrator or central inventory server for quality control purposes. Particular embodiments include the derivation of tachometric information from the detectable indicia. Embodiments may also include inventory programs which maintain fan ID data for a plurality of fans.

According to one aspect of the present invention, a method includes: reading a coded signal generated by a fan having an integral optical sensor which detects coded indicia applied to a rotating member of the fan, wherein the fan cools a predetermined component in a computer system; determining the fan type, wherein the coded signal read in said reading is used as a basis for the determination; and establishing a parameter which controls an aspect of the computer system based on said determination.

In one embodiment the parameter is one which affects the speed of the fan for controlling air flow in proximity of the predetermined component. The parameter can control a voltage level which controls the fan's speed, or a pulse width modulation signal which controls the fan's speed.

In one embodiment, the method further includes performing a second function in the computer system based on any of said reading, said determination, and combinations thereof. The second function may be a tachometric function which derives fan speed based on the coded signal read in association with said reading. Alternatively, the second function may be a reporting function, based on said determination, which reports the fan type to an entity which is other than the computer system. This entity may be a server coupled to the computer system over a network, or a network administrator over a network.

In one embodiment, the basis for said determination is made by associating fan type to the coded signal read in association with said reading of the coded signal and selecting the fan type based on the coded signal. The association of the fan type to the coded signal may be implemented as a lookup table with the coded signal being used as a table reference for selecting the fan type.

In one embodiment, the method further includes running the fan at a predetermined speed during said reading of the coded signal, the predetermined speed being slower than a nominal fan speed.

BRIEF DESCRIPTION OF THE DRAWINGS

Some of the purposes of the invention having been stated, others will appear as the description proceeds, when taken in connection with the accompanying drawings, in which.

DETAILED DESCRIPTION OF THE ILLUSTRATIVE EMBODIMENTS

While the present invention will be described more fully hereinafter with reference to the accompanying drawings, in which a preferred embodiment of the present invention is shown, it is to be understood at the outset of the description which follows that persons of skill in the appropriate arts may modify the invention here described while still achieving the favorable results of this invention. Accordingly, the description which follows is to be understood as being a broad, teaching disclosure directed to persons of skill in the appropriate arts, and not as limiting upon the present invention.

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Figure 1:
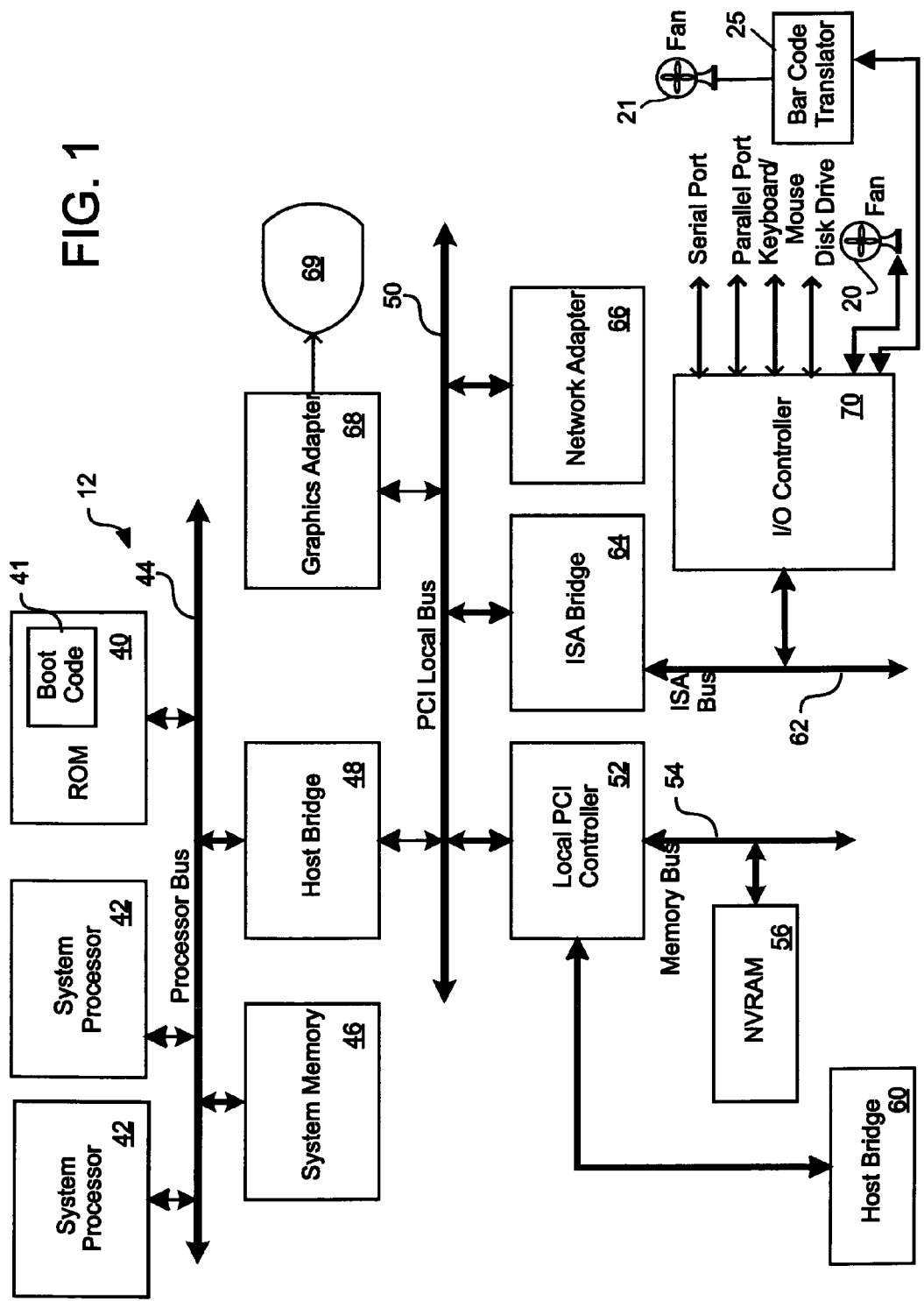
FIG. 1 is a block diagram of a computer system according to a preferred embodiment of the present invention which incorporates the fan control, identification, and reporting features which are to be described.

Referring to the accompanying drawings, in which like numerals indicate like elements or steps throughout the several views, FIG. 1 is a block diagram of a non-limiting computer system according to a preferred embodiment of the present invention which incorporates the fan control, identification, and reporting features herein described.

Referring now more particularly to FIG. 1, there is depicted a block diagram of a non-limiting embodiment of a computer system 12. The illustrative embodiment depicted in FIG. 1 may be a desktop computer system, such as one of the ThinkCentre® or ThinkPad® series of personal computers sold by Lenovo (US) Inc. of Purchase, N.Y., or a workstation computer, such as the Intellistation®, which are sold by International Business Machines (IBM) Corporation of Armonk, N.Y.; however, as will become apparent from the following description, the present invention is applicable to advanced fan control, identification and reporting by any type of data processing system.

As shown in FIG. 1, non-limiting computer system 12 includes at least one system processor 42, which is coupled to a Read-Only Memory (ROM) 40 and a system memory 46 by a processor bus 44. System processor 42, which may comprise one of the PowerPC™ line of processors produced by IBM Corporation, is a general-purpose processor that executes boot code 41 stored within ROM 40 at power-on and thereafter processes data under the control of operating system and application software stored in system memory 46. System processor 42 is coupled via processor bus 44 and host bridge 48 to Peripheral Component Interconnect (PCI) local bus 50.

PCI local bus 50 supports the attachment of a number of devices, including adapters and bridges. Among these devices is network adapter 66, which interfaces computer system 12 to LAN 10, and graphics adapter 68, which interfaces computer system 12 to display 69. Communication on PCI local bus 50 is governed by local PCI controller 52, which is in turn coupled to non-volatile random access memory (NVRAM) 56 via memory bus 54. Local PCI controller 52 can be coupled to additional buses and devices via a second host bridge 60.

Computer system 12 further includes Industry Standard Architecture (ISA) bus 62, which is coupled to PCI local bus 50 by ISA bridge 64. Coupled to ISA bus 62 is an input/output (I/O) controller 70, which controls communication between computer system 12 and attached peripheral devices such as a keyboard, mouse, and a disk drive. In addition, I/O controller 70 supports external communication by computer system 12 via serial and parallel ports.

Figure 2:
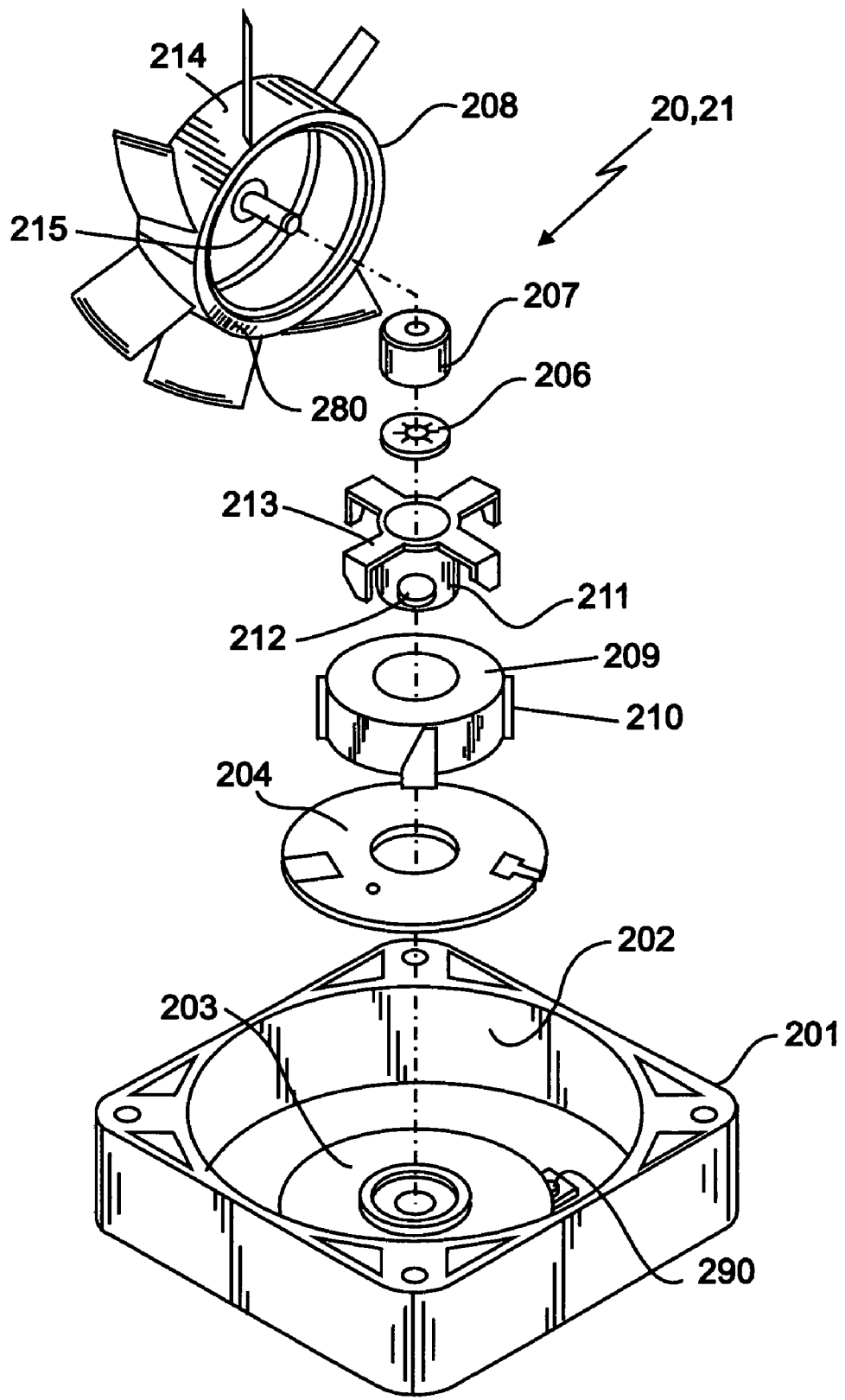
FIG. 2 illustrates a cooling fan in a computer system in accordance with an embodiment of the present invention.

FIG. 2 illustrates an embodiment for cooling fan 20, 21 of FIG. 1. Referring to FIG. 2, cooling fan 20, 21 may include a housing 201 with a circular recess 202 defined therein and a seat 203 formed at a bottom face thereof. A circuit board 204, a stator assembly 205, a collar 206, a self-lubricating bearing 207 and a rotor 208 are in turn coaxially mounted in recess 202 of housing 201.

Circuit board 204 is secured on seat 203 of housing 201. Stator assembly 205 has a coil 209 with an opening (not shown) and is fixedly mounted on circuit board 204 by a bracket 210 provided beneath coil 209. A sleeve 211, of which a first end is enclosed, is received in the opening of coil 209. Sleeve 211 has an external dome 212 formed at the first end thereof. A fastener 213 composed of a plurality of wings (not shown) is integrally formed with a second end of sleeve 211, wherein the wings each comprise a laterally extended arm (not shown) and a finger (not shown) perpendicularly extended from a distal edge of the arm and toward the first end of sleeve 211. The arms of the wings are engaged with a top face of coil 209 and the fingers of the wings are engaged with an outer circumference of coil 209 to fasten sleeve 211 on coil 209.

Collar 206 defines an aperture (not shown) and is provided on a bottom face of sleeve 211. The self-lubricating bearing 207 is received and secured in sleeve 211 and placed upon collar 206.

Rotor 208 includes coded indicia 280 in the form of a bar-code label disposed on rotating hub 214. Persons of ordinary skill in the art will readily recognize alternative placements for bar-code label 280. Each cooling fan 20, 21 may include a different barcode label placed on rotating hub 214 thereby allowing different cooling fans 20, 21 to be identified as explained in further detail below.

Rotor 208 may further include a core 215 formed at the center thereof. Core 215 has a head formed at a distal end thereof. Core 215 is secured in self-lubricating bearing 207 and the head of core 215 is inserted through collar 206 and received in dome 212.

Cooling fan 20, 21 includes an integral optical sensor 290 placed at a fixed location in fan housing 201. For example, optical sensor 290 may be placed along the outer rim of seat 203 at the base of housing 201 and in-line with the barcode label 280. To provide guidance to the artisan, and not for purposes of limitation, sensor 290 may be an Agilent Technologies HBCS-1100 High Resolution Optical Reflective Sensor (or the like); information for which can be found at the Agilent web site. Sensor 290 may be configured to detect the passing of the coded indicia 280, the barcode label, placed on rotating hub 214 as cooling fan 20, 21 rotates as discussed above. Sensor 290 may further be configured to generate a sequence of pulses corresponding to the detected indicia 280. This generated pulse signal may be transmitted by sensor 290 to the system processor 42 via I/O controller 70 as will be described in further detail. System processor 42 may determine a particular type of cooling fan for cooling fan 20, 21 based on the generated pulse signal. Once system processor 42 determines the particular cooling-fan type, it establishes particular control parameters set for that particular type of cooling fan to control cooling fan 20, 21 so that it operates optimally. Depending on the type of fan, the parameters can control, for example and not for the purposes of limitation, a voltage level which controls the fan's speed, or a pulse width modulation signal which controls the fan's speed.

It is noted that cooling fan 20, 21 may include elements which are different than those presented herein and that FIG. 2 is illustrative of a sample embodiment of cooling fan 20, 21. It is further noted that the present invention is not to be limited in scope to any particular embodiment, including the embodiment discussed herein, but rather is to include the principles discussed herein.

Returning to FIG. 1, there depicted are two non-limiting fans 20, 21 of the type shown and described in FIG. 2 and each of which are mechanically arranged so as to move air in the vicinity of each of the two system processors 42. Fans 20, 21 are preferably arranged so as to blow air across the fins of a heat sink (not shown) which is thermally coupled to each of system processors 42.

Two embodiments are shown in FIG. 1. In one embodiment, optical sensor 290 of fan 21 is coupled to bar code translator 25, which in turn is coupled to I/O controller 70. In this embodiment, barcode translator 25 is based on any of a variety of industry-standard parts and is utilized to directly read the optical signal pulses emitted by the optical sensor 290 of fan 21. Fixed optical sensor 290 reads bar coded indicia 280, which is disposed on rotating hub 214, and generates an electrical signal corresponding to the coded indicia. Those skilled in the art may implement barcode translator 25 by combining functions described herein with macros from industry standard barcode translators such as National Semiconductor LM93, LM85, or the like. The artisan is directed to, for example, Application Brief 114 entitled "*Autonomous Fan Control For Processor Systems Using The LM*85," as published by National Semiconductor. Barcode translator 25 directly decodes the optical signals and generates parallel barcode data, in byte or word form, which is then made available to I/O controller 70. This parallel barcode data is representative of the electrical signal generated by the optical sensor of the fan and is made available to system processor 42 via I/O controller 70 as processor-accessible or processor-addressable data.

In one embodiment, optical sensor 290 of fan 20 is coupled directly to I/O controller 70 for direct serial access by a system processor 42. In this embodiment, system processor 42 directly serially reads the optical signal pulses emitted by optical sensor 290 of fan 20 according to well-known methods such as bit polling. Once the data is made available to the processor 42, well-known methods such as those used by bar code translator 25 may be used to decode the coded data. Details concerning the decoding of bar coded data, as performed by industry standard parts, are well known in the art and are omitted so as to not obfuscate the present disclosure in unnecessary detail. Although processor intensive, this embodiment provides a low-cost and minimal part count solution.

As described in these embodiments, therefore, the fan signals can be picked up directly by processor 42 as an electrical signal, in the case of a serial-bit-polling embodiment wherein the electrical signal emitted by the optical sensor 290 is read directly, or indirectly as data, in the case where data is read in parallel as provided by barcode translator 25 via I/O controller 70.

It is preferable to read the optical indicia, in order to obtain the fan specific data, once each time the machine is started from cold so that the fan may be operated at a speed which is optimal for the reading of the barcode data. The optimal speed for reading the barcode data from the fan is slower than expected fan speeds while the system is running hot. Additionally or alternatively, system temperature can be taken into account when a decision is to be made as to whether to operate the fan at a slower speed in order to read the optical indicia. If the system temperature is high, the reading may be bypassed.

The decoded data may contain data of fine granularity as encoded by barcode label 280 and may include manufacturer data, fan type, fan part number, lot number, fan serial number, etc. This data may be used in a variety of different circumstances including the setting of particular control parameters which correspond to the type of cooling fan, or the exact model number as the case may be, to optimally control cooling fan 20, 21. For this purpose, for example to determine the fan type, an inventory program may be executed by processor 42 and may include a table which may be stored in a non-volatile memory, or downloaded from the Internet, which gives optimal parameters which correspond to any of the decoded data. For example, the control parameters may include parameters which control the speed of fan 20, 21 based on the determined fan type or part number. The parameters are then established in the system to control the speed of the fan based on the determined fan type or part number. The table may be implemented as a lookup table with the coded signal or the coded data being used as a table reference for selecting the fan type.

In addition to establishing optimal control parameters for fan 20, 21, the electrical signal emitted by optical sensor 290 may also be used to perform a second function in the system. For example, the electrical pulses emitted by optical sensor 290, which correspond to the bar coded indicia, may also be used in the system to provide a tachometer function. Thus, the electrical pulses emitted by optical sensor 290 may be processed through an integrator, whether it be a hardware- or software-implemented integrator, to give the equivalent of an index pulse from which the speed of the fan can be derived in real time. It is expected however that no integrator may be needed while taking tachometric readings at high speed, that is the speed which is expected for the fan's cooling function while the system is running hot, since at high speed any detected edge may serve this purpose.

In one embodiment, this tachometric function is preferably built into barcode translator 25 such that tachometric data is precalculated and provided by barcode translator 25 as tachometric data stored in a register of bar code translator 25, such register could be addressed/read directly by system processor 42 through I/O controller 70. However, the present invention is not to be limited in scope to any given embodiment. As alternatives, the tachometer signal may be taken by a system processor 42 through I/O controller 70 in any form and calculated directly; it also may be calculated by system processor 42 as a function of the frequency by which barcode translator 25 routinely reports each decode.

The description returns now to the secondary function of the fan related signals. As a further example of using any of the fan related signals, whether they be electrical signals directly read off of the fan 20 or indirectly via fan 21 through barcode translator 25, for performing a second function in the system, the decoded data may be transferred over a network by system processor 42 to report the fan type, or any other information, to an entity which is other than the computer system. The transfer may be to a server or an administrator across the network and transferred for the purpose of reporting any of the fan parameters including model number, manufacturer, etc. This information can be used for quality control purposes, as in, for example, where it is knowing that a particular type of fan is having quality control problems, the existence of a particular type of fan being used in a system may be thus reported and the administrator may order new parts for replacement. Likewise, similar reporting and replacement can be made by lot number or even by a serial number range.

In the drawings and specifications there has been set forth a preferred embodiment of the invention and, although specific terms are used, the description thus given uses terminology in a generic and descriptive sense only and not for purposes of limitation.

What is claimed is:

1. Apparatus comprising:
   a main processor which executes instructions stored in an accessible memory;
   a fan having an integral optical sensor wherein the optical sensor reads coded indicia disposed on a rotatable portion of the fan and generates an electrical signal corresponding to the coded indicia; and
   fan circuitry which couples said main processor and said fan and which provides data to said main processor as processor-addressable data, the data being representative of the electrical signal generated by the optical sensor of said fan;
   wherein,
   the data is used in said apparatus to identify a characteristic of said fan, and
   a fan-related signal is used in said apparatus to perform a second function, the fan-related signal being selected from the group consisting of the electrical signal and the data.

2. Apparatus according to claim 1 wherein a parameter which controls the speed of said fan is established as a function of the data.

3. Apparatus according to claim 2 wherein the second function is a tachometric function which derives fan speed from the fan-related signal.

4. Apparatus according to claim 2 wherein the second function is a function which reports a fan characteristics over a network.

5. Apparatus according to claim 2 wherein the fan is run at a predetermined speed while the optical sensor reads the coded indicia disposed on the rotatable portion of the fan, the predetermined speed being slower than a nominal fan speed.

6. Apparatus according to claim 2 wherein said main processor executes instructions stored in the accessible memory which are effective to identify the characteristic of said fan by decoding the data.

7. Apparatus according to claim 2 wherein the fan circuitry further includes:
   a register which is addressable by said main processor; and
   a translator which decodes the electrical signal and generates the data as decodes data which identifies the characteristic of said fan and stores the data in said register for access by said main processor.

8. Apparatus comprising:
   a main processor which executes instructions stored in an accessible memory;
   a fan having an integral optical sensor wherein the optical sensor reads bar code indicia disposed on a rotatable portion of the fan and generates a bar code signal corresponding to the bar code indicia, the bar code indicia having therein encoded at least one fan characteristic; and
   a bar code translator which is operatively coupled to said main processor and to the optical sensor of said fan, receives the bar code signal and generates bar code data which is accessible by said main processor, and which provides tachometric resources to said main processor based on the bar code signal, the bar code data identifying one or more characteristics of said fan;
   wherein said main processor executes instructions stored in the accessible memory which are effective to:
   read the bar code data;
   determine the fan type; and
   establish a parameter which controls the speed of said fan based on the determined fan type.

9. Apparatus according to claim 8 wherein the tachometric resources are selected from the group consisting of a tachometer signal and tachometric data stored in a register of said bar code translator.

10. Apparatus according to claim 9 wherein said main processor executes further instructions which are effective to report the fan type to an entity which is other than the apparatus.

11. Apparatus of claim 10 wherein the entity is an entity selected from the group consisting of a server coupled to the apparatus over a network, and a network administrator having access to the network.

12. Apparatus according to claim 11 wherein said fan is run at a predetermined speed while the optical sensor reads the bar code indicia disposed on the rotatable portion of the fan, the predetermined speed being slower than a nominal fan speed.

13. Apparatus according to claim 12 wherein said fan is mounted in proximity to said main processor and configured to move air across a heat sink which is thermally coupled to said main processor.

14. A method comprising:
reading a coded signal generated by a fan having an integral optical sensor which detects coded indicia applied to a rotating member of the fan, wherein the fan cools a predetermined component in a computer system;
determining the fan type, wherein the coded signal read in said reading is used as a basis for the determination; and
establishing a parameter which controls an aspect of the computer system based on said determination.

15. The method of claim 14 wherein said parameter is one which affects the speed of the fan for controlling air flow in proximity of the predetermined component.

16. The method of claim 15 wherein said parameter controls a signal selected from the group consisting of a voltage level which controls the fan's speed and a pulse width modulation signal which controls the fan's speed.

17. The method of claim 15 further comprising:
performing a second function in the computer system based on any of said reading, said determination, and combinations thereof.

18. The method of claim 17 wherein the second function is a tachometric function which derives fan speed based on the coded signal read in association with said reading.

19. The method of claim 17 wherein the second function is a reporting function, based on said determination, which reports the fan type to an entity which is other than the computer system.

20. The method of claim 19 wherein the entity is an entity selected from the group consisting of a server coupled to the computer system over a network, and a network administrator requesting fan-type data over a network.

21. The method of claim 14 wherein the basis for said determination is made by associating fan type to the coded signal read in association with said reading of the coded signal and selecting the fan type based on the coded signal.

22. The method of claim 21 wherein the association of the fan type to the coded signal is implemented as a lookup table with the coded signal being used as a table reference for selecting the fan type.

23. The method of claim 14 further comprising:
running the fan at a predetermined speed during said reading of the coded signal, the predetermined speed being slower than a nominal fan speed.

* * * * *